(12) United States Patent
Iotti

(10) Patent No.: US 7,327,117 B2
(45) Date of Patent: Feb. 5, 2008

(54) PROCESS FOR MEASURING PHASE CURRENTS OF A DEVICE FOR CONTROLLING ELECTRIC MOTORS MADE WITH IMS TECHNOLOGY OR THE LIKE EMBEDDING, FOR SUCH MEASURE, RESISTANCE AND TEMPERATURE CONTROL DEVICE FOR POWER TRANSISTORS

(75) Inventor: Maurizio Iotti, Bagnolo In Piano (IT)

(73) Assignee: Zapi S.p.A. (IT)

( * ) Notice: Subject to any disclaimer, the term of this patent is extended or adjusted under 35 U.S.C. 154(b) by 17 days.

(21) Appl. No.: 10/624,118

(22) Filed: Jul. 21, 2003

(65) Prior Publication Data

US 2004/0017173 A1 Jan. 29, 2004

(30) Foreign Application Priority Data

Jul. 26, 2002 (IT) ................................. PR2002A0037

(51) Int. Cl.
*H02P 5/28* (2006.01)

(52) U.S. Cl. ................. 318/798; 318/461; 318/432; 318/434

(58) Field of Classification Search ......... 318/798–803, 318/461, 432, 434
See application file for complete search history.

(56) References Cited

U.S. PATENT DOCUMENTS

| 5,081,379 | A | * | 1/1992 | Korteling .................. 327/50 |
| 5,280,228 | A | * | 1/1994 | Kanouda et al. ............ 318/803 |
| 5,373,436 | A | * | 12/1994 | Yamaguchi et al. .......... 363/98 |
| 5,501,517 | A | | 3/1996 | Kiuchi |
| 5,844,743 | A | | 12/1998 | Funches |
| 5,886,515 | A | * | 3/1999 | Kelly .................... 323/313 |
| 6,005,366 | A | * | 12/1999 | Majumdar et al. .......... 318/811 |
| 6,028,426 | A | | 2/2000 | Cameron et al. |
| 6,166,464 | A | | 12/2000 | Grant |
| 6,424,026 | B1 | | 7/2002 | Mangtani |

* cited by examiner

*Primary Examiner*—Rina Duda
(74) *Attorney, Agent, or Firm*—Shlesinger Fitzsimmons

(57) ABSTRACT

The invention is applied to the field of industrial controls for electric motors and more precisely refers to a process for measuring phase currents of an inverter or a DC controller consisting in detecting the temperature of a copper path made with IMS (Insulated Metal Substrate) technology and the like, used as shunt and that is the extension of a pre-existing adduction line towards a motor or towards the supply line or towards power devices, and in compensating through software the path drop in order to have an accurate measure of the current crossing it. A heat sensor is applied next to or over such copper path to detect its temperature. This latter one will also be assumed, with an acceptable degree of approximation, as the power transistors temperature.

5 Claims, 1 Drawing Sheet

PROCESS FOR MEASURING PHASE CURRENTS OF A DEVICE FOR CONTROLLING ELECTRIC MOTORS MADE WITH IMS TECHNOLOGY OR THE LIKE EMBEDDING, FOR SUCH MEASURE, RESISTANCE AND TEMPERATURE CONTROL DEVICE FOR POWER TRANSISTORS

DESCRIPTION

The present invention deals with a process for measuring phase currents in an inverter or a DC controller for supplying electric motors and an inverter or DC controlled in IMS technology or the like embedding resistances for this measure.

The term inverter or DC controller means any control device for electric motors including Permanent Magnet Motors, Serial Motors, Separate Energisation Motors, Split Motors, Stepped Motor, DC Brushless Motors, AC Brushless Motors, Synchronous Motors, Asynchronous (Induction) Motors, Reluctance Motors and others.

The term IMS technology or the like refers to any arrangement realising a power stage for controlling motors characterised in having:

- copper connection paths between elementary power devices and access terminals towards the outside (typically, but not exclusively, made with the photo-etching method used in printed circuits): such paths are electrically insulated from the substrate below (typically metallic and herein below called Base) by a layer of insulating material;
- a high thermal capacity so that the temperature of all Base points can be deemed homogeneous, with a limited error;
- a low thermal resistance between the above copper paths and the die (body) of elementary power devices so that temperature of power devices (on die) and temperature of copper paths on which they are applied, can be equalised, with a limited error;
- a low thermal resistance between the above copper paths and the metal Base below so that temperature of copper paths and temperature of metal Base below can be equalised, with a limited error.

In the electric motors supplying systems, through inverter or DC controller, it is necessary to monitor in real time two major parameters to avoid system damages, namely:

- power devices (power transistors) temperature through a thermal sensor;
- current absorbed by the electric motor, in particular. When supplying two-phase and three-phase motors, applications are known where currents of at least two phases are measured.

For checking motors in cc applications are know where armature current is measured.

As an alternative, whatever the motor type is, applications are known in which current is measure on the power line or in series with power devices.

For monitoring currents, a known technique provides for inserting precision shunt resistances, without thermal drift, namely without resistance variation when the temperature changes.

This allows measuring inverter or DC controller currents with extreme accuracy.

This known arrangement, though being technically valid, has the inconvenience of being costly and cumbersome due to the insertion of these shunts.

The thermal sensors are applied, according to the known art, next to power transistors to detect their temperature.

Object of the present invention is thereby reducing manufacturing costs and times, reducing encumbrance of an inverter or DC controller of the type with IMS (Insulated Metal Substrate) technology or the like, increasing assembly reliability and solving the problem of thermally exhausting the dissipated power from precision resistances, all this without impairing measure efficiency and accuracy.

Arrangements in IMS technology and the like are dealt with having to include arrangements, typically called differently from IMS, but substantially characterised in the same way as regards the present invention.

An abbreviation for everything that falls within the above scope is DBC (Direct Bonded Copper), and is the realisation technique for integrated power modules (Power Semiconductor Modules) that are composed of a copper substrate, of an insulating layer (typically ceramics) and of the overlying copper plates on which power chips terminals are welded.

This object is fully reached in the present process for measuring phase currents of a control devices for electric motors, that is characterised in the below-listed claims and particularly in that in an embodiment of the IMS type (or the like) for controlling motors, copper connection paths are provided towards power devices and external connections (motor and supply line), a thermal sensor for checking power transistor temperature being preferably (but not necessarily) placed next to (or above) the path whose current has to be measured.

The current measuring process provides for the measure, through said sensor, of the temperature of a pre-existing copper adduction path, possibly elongated for such purpose, inserted in IMS technology in series with a connection terminal to the outside or with power devices, and for compensating, through software, the path drop to have an accurate measure of current in the copper path itself.

The temperature measured on the current adduction path will be assigned, with a limited error, also to power transistor cases.

These and other features will be better pointed out by the following description of a preferred, but not exclusive embodiment, shown merely as a non-limiting example, of the enclosed table of drawing, in which.

Figure 1:
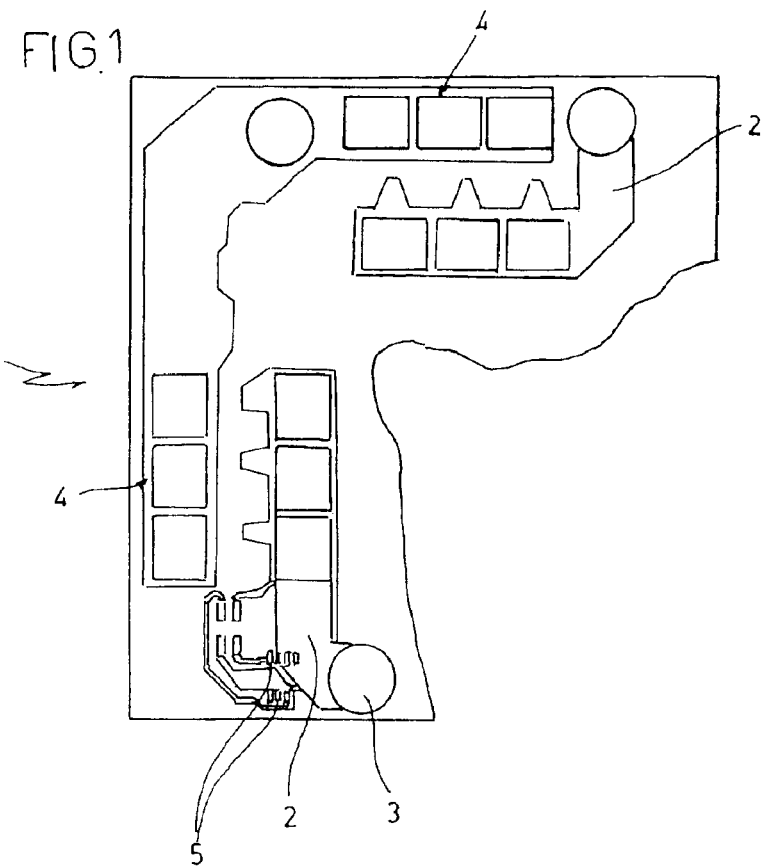
FIG. 1 shows a card portion for an inverter.

With reference to the figures, 1 shows a card made with IMS technology and namely of the type comprising an aluminium support plate for an insulating layer on which a copper circuit is included.

Reference 2 shows a copper path inserted between connection point 3 of a motor phase and power transistors 4.

On the copper path 2 a thermal sensor 5 is inserted for measuring the path temperature.

Since in the IMS system a low thermal resistance aluminium support is provided, it can be deemed that the temperature measured on the copper path is substantially equal to the temperature existing on the power transistor base inserted in the inverter.

The process advantageously provides for compensating, through the temperature measure and through an already present software for managing the inverter, the voltage drop due to thermal drift of copper path resistivity.

Moreover, if, as in case of an inverter, the currents to be measured are more than one, it is allowed to use a single sensor on only one of the two adduction paths, provided that they have similar sizes.

This because inverter currents are balanced (the two paths are subjected to the same current state) and, as specified, it is assumed that the IMS substrate (or the like) has a sufficiently high thermal capacity to homogeneously distribute the temperature on the whole metal Base area.

The copper path can be also realised with another metal.

The thermal drift of copper resistivity is expressed by the following formula:

$$\rho_T = \rho_{To} * (1+0.0039*(T-To)) \text{ with:}$$

$\rho_T$=Resistivity at Temperature $T$ $\rho_{To}$=Resistivity at Temperature $To$ The voltage drop on the copper path section (used for measuring) will be amplified and therefore, through an analogue-digital conversion, supplied to the processing unit. Let us call such value Vi.

The software performs a thermal compensation that is divided into the following operations:
1) the software recognises the Resistance (Ro) that the measuring path has at a certain Temperature (To)
2) the software will have a cyclic structure and, upon every iteration, will detect the actual temperature (T) by reading the thermal sensor
3) by knowing the previous temperature (T), it will compute the actual value (RT) of the measuring path resistance according to the formula:

$$R_T = Ro(1+0.0039(T-To))$$

4) concluding, the software will determine the current value in the path through the relationship:

$$I = Vi/R_T$$

It has been stated that the copper path temperature (T) will be used also as approximate measure of the power transistor temperature, This is true when providing low thermal resistance hypotheses between overlapped layers.

This hypothesis can be verified on line, through software, in the following way. By knowing the copper path dissipation (Pd=$R_T I^2$) and the Thermal Resistance (Rth$_{PB}$) between copper Path and Base, the metal Base Temperature $T_B$) can be computed:

$$T_B = T - Rth_{PB} * Pd$$

Knowing $T_B$ and the thermal resistance of power transistors, together with the thermal power they dissipate, their temperature can be computed.

Figure 2:
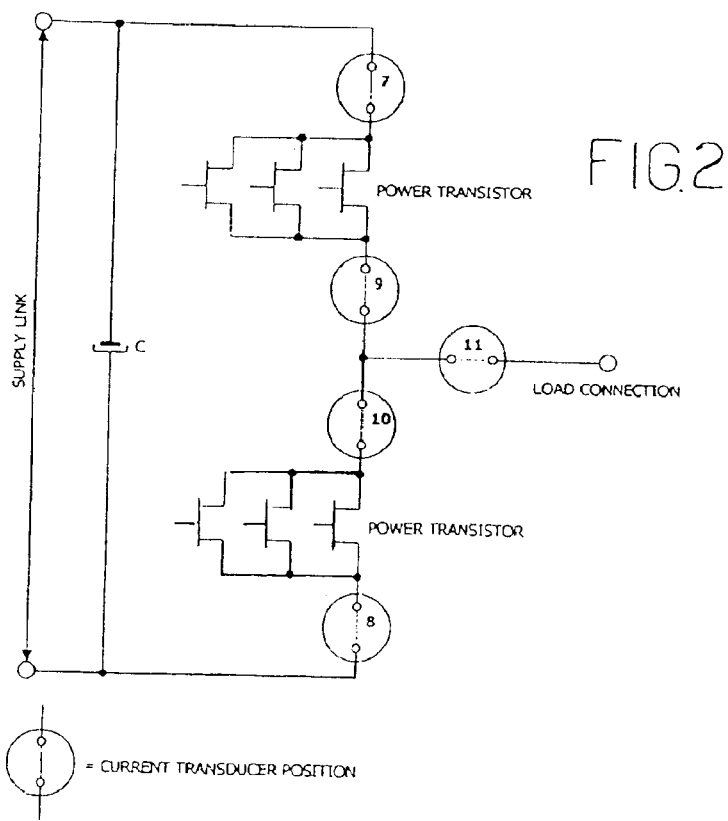
FIG. 2 shows an application diagram of the current transducer position depending on control device application.

With reference to FIG. 2, when supplying two-phase or three-phase motors, applications are known where currents are measured of at least two phases (position 11 in FIG. 2), while for checking direct current motors, applications are known where the armature current is measured (position 11 in FIG. 2).

Alternatively, whichever the type of motor, applications are known in which the power supply current (positions 7 and 8 in FIG. 2) is measured or the current in series with power devices (positions 9 and 10 in FIG. 2) is measured.

What is claimed is:

1. Insulated Metal Substrate (IMS) Control device for supplying an electric motor with composing:

an inverter of at least two-phases;

an IMS metal path on at least two of the at least two phases on the inverter power circuit and in series with a motor phase;

a thermal sensor in thermal communication with the metal path to measure the temperature of the metal path and a temperature of power transistors of the control device.

2. Insulated Metal Substrate (IMS)Control device for supplying an electric motor with comprising:

a DC controller;

a metal path of the controller formed in IMS technology on a controller card and in series with a motor armature;

a thermal sensor in thermal communication with the metal path to perform the measure of its temperature.

3. Insulated Metal Substrate (IMS)Control device for supplying power to an electric motor comprising:

an integrated power module;

at least one metal path in series with at least one of power devices and an external connection terminal;

a thermal sensor in thermal communication with the metal path to measure its temperature.

4. Process for measuring the phase currents of an electric motor power supply comprising:

measuring the temperature of at least one Insulated Metal Substrate (IMS) metal path as elongation of a connection path between power or adduction devices towards outside;

compensating for a voltage drop due to thermal drift of the metal path's resistivity through software computation; and thereby having the exact phase current measure.

5. Process according to claim 4 further comprising measuring the output current of a Power Semiconductor Module by measuring the temperature of at least one of an IMS metal path and a Direct Bonded Copper (DBC) metal path as elongation of a connection path between power or adduction devices towards outside and for compensating the voltage drop due to thermal drift of metal path resistivity through software computation and then having the exact phase current measure.

* * * * *